United States Patent
Cope et al.

(10) Patent No.: US 12,231,143 B2
(45) Date of Patent: Feb. 18, 2025

(54) RADIO TRANSMITTER PROVIDING AN ANALOG SIGNAL WITH BOTH RADIO FREQUENCY AND BASEBAND FREQUENCY INFORMATION

(71) Applicant: Analog Devices International Unlimited Company, Limerick (IE)

(72) Inventors: Mark Cope, Bath (GB); Antonio Montalvo, Raleigh, NC (US)

(73) Assignee: Analog Devices International Unlimited Company, County Limerick (IE)

( * ) Notice: Subject to any disclaimer, the term of this patent is extended or adjusted under 35 U.S.C. 154(b) by 204 days.

(21) Appl. No.: 18/057,933

(22) Filed: Nov. 22, 2022

(65) Prior Publication Data

US 2023/0179222 A1    Jun. 8, 2023

Related U.S. Application Data

(60) Provisional application No. 63/286,288, filed on Dec. 6, 2021.

(51) Int. Cl.
    *H03M 1/66*     (2006.01)
    *H04B 1/04*     (2006.01)

(52) U.S. Cl.
    CPC ............ *H03M 1/662* (2013.01); *H04B 1/04* (2013.01)

(58) Field of Classification Search
    CPC ........ H03M 1/662; H03M 1/1245; H04B 1/04
    USPC .......................... 341/144, 145, 120, 118, 155
    See application file for complete search history.

(56) References Cited

U.S. PATENT DOCUMENTS

| | | |
|---|---|---|
| 5,880,633 A | 3/1999 | Leizerovich et al. |
| 7,224,722 B2 | 5/2007 | Shi et al. |
| 8,194,785 B2 | 6/2012 | Zolfaghari et al. |
| 8,213,888 B2 | 7/2012 | Kuriyama et al. |
| 8,249,530 B2 | 8/2012 | Sun et al. |
| 8,774,327 B2 | 7/2014 | Behzad et al. |
| 8,891,681 B2 | 11/2014 | Boos et al. |
| 9,088,308 B2 | 7/2015 | Soe |
| 9,847,802 B1 | 12/2017 | Farley et al. |
| 10,033,330 B2 | 7/2018 | Schemmann et al. |
| 10,044,382 B2 | 8/2018 | Petrovic et al. |
| 10,270,510 B1 | 4/2019 | Wang et al. |
| 10,778,263 B2 | 9/2020 | Patel et al. |
| 11,387,790 B2 | 7/2022 | Cope et al. |
| 11,533,070 B2 | 12/2022 | Pratt et al. |

(Continued)

OTHER PUBLICATIONS

Razavi, B., "The Future of Radios" IEEE 2015 in 8 pages.

(Continued)

*Primary Examiner* — Peguy Jean Pierre
(74) *Attorney, Agent, or Firm* — Knobbe, Martens, Olson Bear, LLP

(57) ABSTRACT

Radio transmitters providing an analog signal with both radio frequency (RF) and baseband frequency information are disclosed herein. In certain embodiments, a transmitter for an RF communication system includes a radio frequency digital-to-analog converter (RFDAC) that outputs the analog signal with two bands of content. In particular, the analog signal includes a first band on content at RF frequency and representing the RF signal for transmission, and a second band of content at baseband frequency and representing baseband information such as the envelope of the RF signal.

20 Claims, 5 Drawing Sheets

(56) References Cited

U.S. PATENT DOCUMENTS

| | | |
|---|---|---|
| 11,563,409 B2 | 1/2023 | Venkitasubramani et al. |
| 2008/0085684 A1* | 4/2008 | Phillips ..................... H03F 3/24 |
| | | 455/114.3 |
| 2008/0261650 A1 | 10/2008 | Piriyapoksombut et al. |
| 2016/0182100 A1* | 6/2016 | Menkhoff ........... H04W 72/541 |
| | | 375/297 |

OTHER PUBLICATIONS

Tomé et al., "A Multiple-Time-Scale Analog Circuit for the Compensation of Long-Term Memory Effects in GaN HEMT Based Power Amplifiers," in IEEE Transactions on Microwave Theory and Techniques, vol. 68, No. dated Sep. 2020 in 15 pages.

* cited by examiner

RADIO TRANSMITTER PROVIDING AN ANALOG SIGNAL WITH BOTH RADIO FREQUENCY AND BASEBAND FREQUENCY INFORMATION

CROSS-REFERENCE TO RELATED APPLICATIONS

The present application claims priority to U.S. Provisional Patent Application No. 63/286,288, filed Dec. 6, 2021, and titled "RADIO TRANSMITTER PROVIDING AN ANALOG SIGNAL WITH BOTH RADIO FREQUENCY AND BASEBAND FREQUENCY INFORMATION," the entirety of which is hereby incorporated herein by reference.

FIELD OF THE DISCLOSURE

Embodiments of the invention relate to electronic systems, and more particularly to, transmitters for radio frequency (RF) communication systems.

BACKGROUND

RF transmitters are used in a variety of applications to transmit RF signals. Example applications using RF transmitters include ultrasound, radar, lidar, and/or cellular communications.

In one example, an RF transmitter includes an RF amplifier used to amplify an RF signal for transmission on an antenna. Additionally, one or more terminals of the RF amplifier can be modulated based on an envelope of the RF signal to enhance performance. For example, by providing modulation in this manner, enhanced efficiency, higher linearity, and/or other performance enhancements can be achieved.

SUMMARY OF THE DISCLOSURE

Radio transmitters providing an analog signal with both radio frequency (RF) and baseband frequency information are disclosed herein. In certain embodiments, a transmitter for an RF communication system includes a radio frequency digital-to-analog converter (RFDAC) that outputs the analog signal with two bands of content. In particular, the analog signal includes a first band of content at RF frequency and representing the RF signal for transmission, and a second band of content at baseband frequency and representing baseband information such as the envelope of the RF signal.

In one aspect, a radio frequency (RF) communication system includes a transmitter configured to receive digital signal data and to output a combined analog signal having a low frequency content corresponding to an analog baseband control signal and a high frequency content corresponding to an RF transmit signal, a low pass filter configured to filter the combined analog signal to generate the analog baseband control signal, and a high pass filter configured to filter the combined analog signal to generate the RF transmit signal.

In another aspect, a radio transmitter includes a digital envelope circuit configured to process digital signal data to extract a signal envelope, and to generate a power control signal based on the signal envelope, a digital transmit signal processing circuit configured to process the digital signal data to generate a digital transmit signal, a digital combiner configured to generate a digital combined signal based on combining the power control signal and the digital transmit signal, and a radio frequency digital-to-analog converter (RFDAC) configured to receive the digital combined signal, and to output a combined analog signal including a low frequency content corresponding to an analog baseband control signal and a high frequency content corresponding to an RF transmit signal.

In another aspect, a method of radio frequency (RF) signal transmission is provided. The method includes outputting a combined analog signal from a transmitter, the combined analog signal having a low frequency content corresponding to an analog baseband control signal and a high frequency content corresponding to an RF transmit signal, filtering the combined analog signal to generate the analog baseband control signal using a low pass filter, and filtering the combined analog signal to generate the RF transmit signal using a high pass filter.

DETAILED DESCRIPTION

Figure 1:
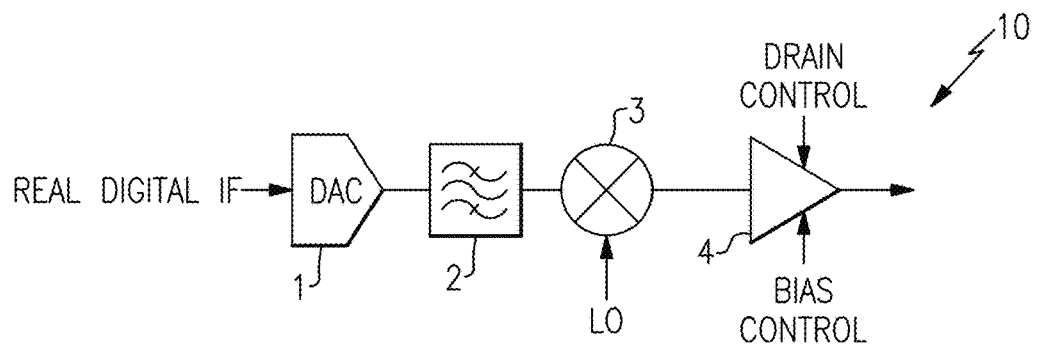
FIG. 1 is a schematic diagram of one example of a radio transmitter.

The following detailed description of embodiments presents various descriptions of specific embodiments of the invention. However, the invention can be embodied in a multitude of different ways. In this description, reference is made to drawings. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Radio frequency (RF) transmitters for wireless networks (for instance, cellular) are constantly striving for improved efficiency and linearity. Enhanced efficiency reduces power consumption and/or system size and weight, while better linearity improves bit error rate (BER) and/or allows for higher spectral efficiency. It is beneficial to enable these enhancements with low complexity and/or cost.

Baseband signals are a mathematical function of the RF envelope, and can be used to modulate the terminals (for example, a drain or a gate of a field-effect transistor or FET) of the same RF power transistor used to amplify the RF signal. By providing modulation in this manner, enhanced efficiency, higher linearity, and/or other performance enhancements can be achieved.

The original source of the RF waveform to be transmitted can be a digital in-phase/quadrature-phase (IQ) waveform (for example, digitally provided to the transmitter from a baseband processor). Such an IQ waveform includes a digital in-phase (I) component and a digital quadrature-phase (Q) component. The digital IQ waveform is processed by the radio transmitter to generate the RF transmit signal and a separate baseband signal for modulation purposes.

To achieve this, certain transmitters include a first digital-to-analog converter (DAC) for generating the RF signal and a second DAC for generating the baseband signal for a modulator.

Radio transmitters providing an analog signal with both RF and baseband frequency information are disclosed herein. In certain embodiments, a transmitter for an RF communication system includes a radio frequency digital-to-analog converter (RFDAC) that outputs the analog signal with two bands of content in the frequency domain. In particular, the analog signal includes a first band on content at RF frequency and representing the RF signal for transmission, and a second band of content at baseband frequency (for example, at or near 0 Hz) and representing baseband information such as the envelope of the RF signal.

In certain implementations, an analog filter network splits the analog signal into a high frequency analog signal (corresponding to an RF transmit signal) and a low frequency analog signal (corresponding to a baseband control signal).

The RF transmit signal is provided along a path through an RF front end to an input of power amplifier, for instance, to a gate of an RF power transistor. Additionally, the power amplifier amplifies the RF transmit signal to generate an amplified RF signal that is wirelessly transmitted using an antenna. The baseband control signal is used in the same transmitter system for additional beneficial signal conditioning. For example, the baseband control signal can serve to enhance efficiency by modulation of the power amplifier's supply voltage (for example, the drain voltage of the RF power transmitter amplifying the RF transmit signal) or by recombining the baseband control signal with the RF signal at the input of the power amplifier (for example, at the gate of the RF power transmitter) to provide bias modulation (for example, gate bias modulation).

Accordingly, the teachings herein allow for a single DAC to produce both signals which can then be separated using analog filters, amplified appropriately and recombined, if desired, by additional analog filters at the RF FET gate when used for gate modulation.

FIG. 1 is a schematic diagram of one example of a radio transmitter 10. The radio transmitter 10 includes a DAC 1, a bandpass filter 2, a mixer 3, and a power amplifier 4.

As shown in FIG. 1, a real digital IF signal is converted to an analog IF signal by the DAC 1, bandpass filtered by the bandpass filter 2, and converted to the desired RF frequency by mixing with a local oscillator (LO) signal using the mixer 3. The RF signal is then amplified by the power amplifier (PA) 4, which may be controlled by a drain control signal and/or a gate (bias) control signal. In certain implementations, the PA's response can be controlled based on the envelope of the RF signal. For example, the drain control signal and/or the bias control signal can be dynamically adjusted based on the envelope of the RF signal.

Figure 2:
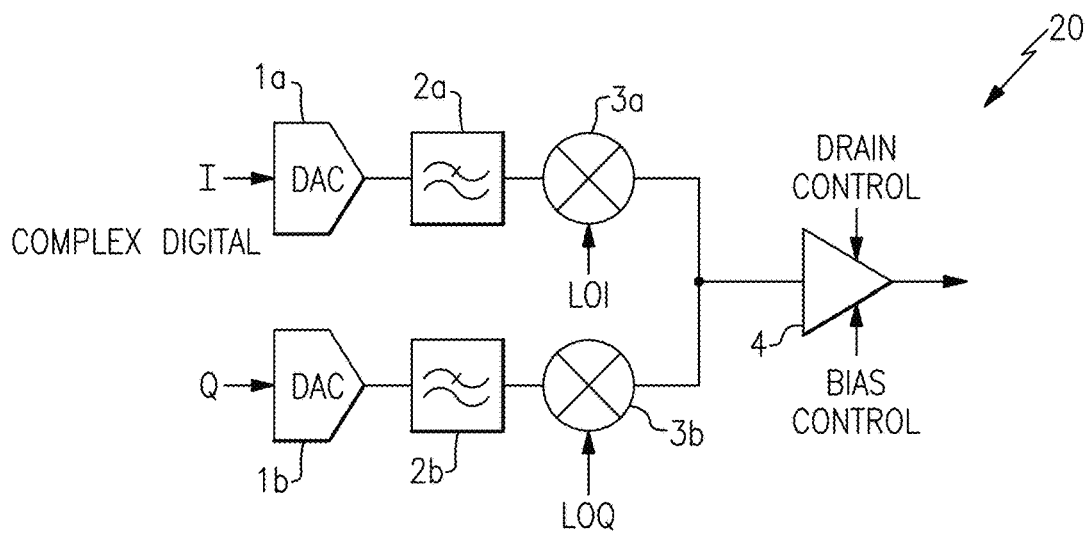
FIG. 2 is a schematic diagram of another example of a radio transmitter.

FIG. 2 is a schematic diagram of another example of a radio transmitter 20. The radio transmitter 20 includes an I-path DAC 1a, an I-path low pass filter 2a, an I-path mixer 3a, a Q-path DAC 1b, a Q-path low pass filter 2b, a Q-path mixer 3b, and a power amplifier 4.

As shown in FIG. 2, the complex digital signal includes a digital I component and a digital Q component, which are in quadrature. The complex digital signal can either be at baseband or at an intermediate frequency. The I-path DAC 1a converts the digital I component to an analog I signal that is filtered by the I-path low pass filter 2a. Additionally, the filtered analog I signal is upconverted by the I-path mixer 3a based on an I-path local oscillator signal LOI. Furthermore, the Q-path DAC 1b converts the digital Q component to an analog Q signal that is filtered by the Q-path low pass filter 2b. Additionally, the filtered analog Q signal is upconverted by the Q-path mixer 3b based on a Q-path local oscillator signal LOQ.

Accordingly, the DACs 1a/1b convert the complex digital signal to an analog signal pair that is then low-pass filtered to remove DAC images. The quadrature mixers 2a/2b convert the baseband or IF analog signal to the desired RF frequency where the signal is amplified by the PA 4.

In certain RF communication systems, it is desirable to control the power amplifier's envelope or bias control dynamically. Some examples of dynamic control of the PA include envelope supply voltage control and envelope bias control. For example, with respect to envelope supply control, a PA's drain voltage is a function of the envelope of the RF signal. Envelope control may be used to improve the power efficiency of the PA. For instance, when the envelope of the signal is small, the PA's drain voltage may also be small so that less power is wasted. Additionally, with respect to envelope bias control, the power amplifier's bias control (for example, gate bias voltage) can be a function of the envelope of the RF signal.

The PA's gain and linearity is a function of the bias current. When the envelope of the signal is small the linearity can be relaxed so that the bias current may be reduced to improve efficiency.

Some types of PAs have signal-dependent characteristics that can be compensated by the bias setting. For example, gallium nitride (GaN) PAs suffer from charge trapping. When the input signal quickly changes from low power to high power, charge trapping can result in a temporary change in the threshold voltage which affects the gain and linearity of the PA. Dynamic control of the PA's bias can compensate for this charge trapping effect.

In many types of transmitter architectures (including, but not limited to, the transmitter architectures of FIGS. 1 and 2), dynamic control of the PA (for instance, for either control of the drain voltage or the gate bias voltage) uses a parallel signal path, which adds cost and complexity.

Figure 3:
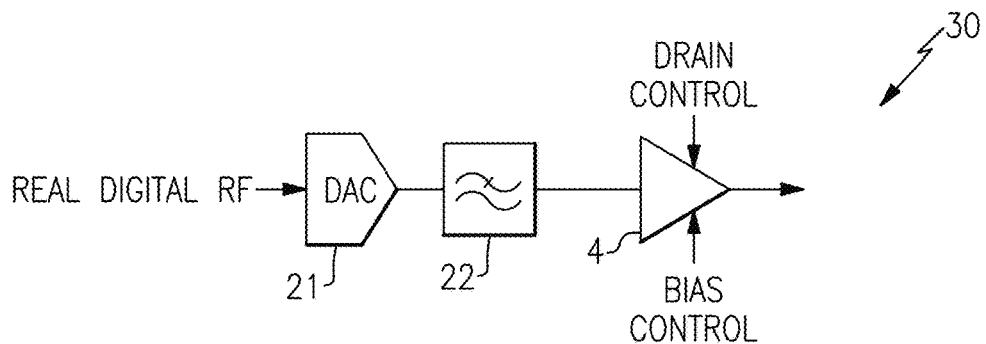
FIG. 3 is a schematic diagram of another example of a radio transmitter.

FIG. 3 is a schematic diagram of another example of a radio transmitter 30. The radio transmitter 30 includes an RFDAC 21, a low pass filter 22, and a power amplifier 4.

RFDAC technology has advanced to the point that the mixing stage can be eliminated and a simplified transmitter architecture shown in FIG. 3 can be used. Here, the conversion to RF is implemented digitally and the input to the RFDAC 21 is the RF signal in digital form. The RFDAC 21 converts the signal to the analog domain where it is low-pass filtered using the low pass filter 22 and thereafter amplified by the PA 4.

The transmitter architectures shown in FIG. 1 and FIG. 2 generate analog bandpass signals. Unlike those architectures, the RFDAC 21 of FIG. 3 can generate analog signals at frequencies anywhere from DC to some fraction (fairly close to 1) of half its sample rate. This creates the possibility of using a single signal path to create both the RF signal and the PA control signal.

Figure 4A:
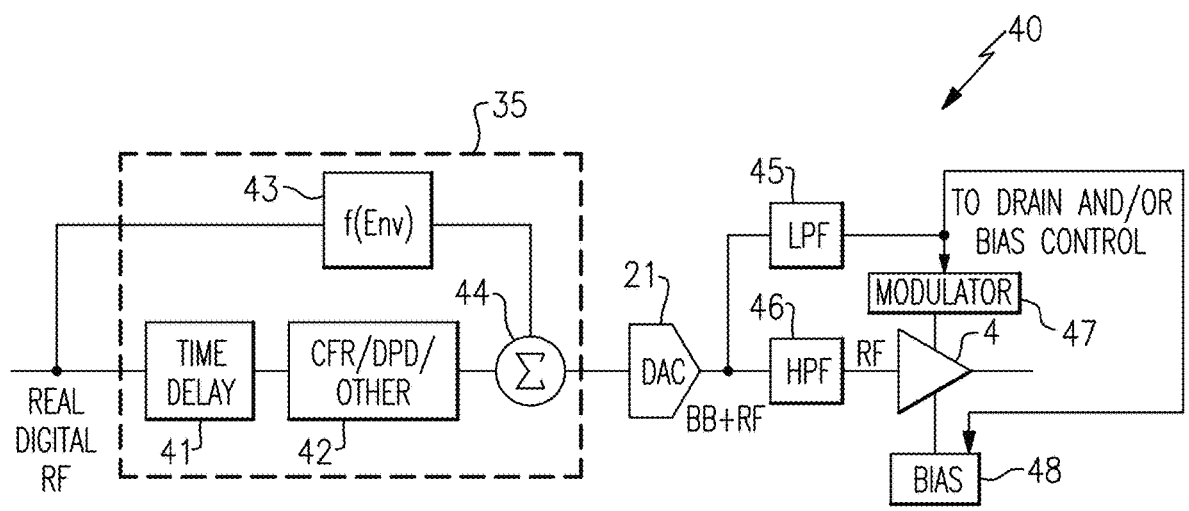
FIG. 4A is a schematic diagram of a radio transmitter according to one embodiment.
Figure 4B:
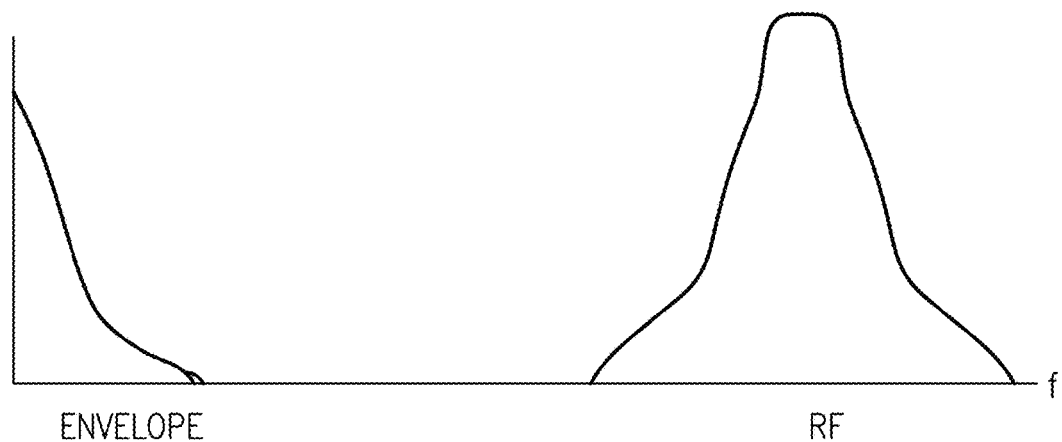
FIG. 4B is a schematic diagram of one example of amplitude versus frequency for a combined baseband and RF signal generated by the radio transmitter of FIG. 4A.

FIG. 4A is a schematic diagram of a radio transmitter 40 according to one embodiment. FIG. 4B is a schematic diagram of one example of amplitude versus frequency for a combined baseband and RF signal generated by the radio transmitter 40 of FIG. 4A.

The radio transmitter 40 includes a power amplifier 4, an RFDAC 21, a digital transmit circuit 35, a low pass filter (LPF) 45, a high pass filter (HPF) 46, a supply modulator 47, and a power amplifier bias circuit 48 (also referred to herein as a bias modulator). The digital transmit circuit 35 includes a digital time delay circuit 41, a transmit signal processing circuit 42, an envelope circuit 43, and a digital combiner 44.

As shown in FIG. 4A, in the digital domain, the envelope is extracted from the digital signal data using the envelope circuit 43. The envelope circuit 43 generates a PA control signal that is some function of the envelope of the signal to be transmitted, and provides the PA control signal to a first input of the digital combiner 44. In parallel, the transmit signal processing circuit 42 performs functions such as crest factor reduction (CFR) and/or digital pre-distortion (DPD) and provides the digital transmit signal to a second input of the digital combiner 44.

The digital combiner 44 combines the PA control signal and the digital transmit signal (representing the RF signal to be transmitted) to generate a composite digital signal. The RFDAC 21 converts the composite digital signal to a combined baseband and RF signal, such as that shown in FIG. 4B. The digital combiner 44 can perform combining just prior to the RFDAC 21 (or in another embodiment prior to sample rate interpolation before the DAC) or in any other suitable manner.

A typical RF signal has a fractional bandwidth much less than 1, and thus is narrow band. The spectrum of the envelope of a narrow band signal has maximum power at DC and a bandwidth that is substantially similar to the bandwidth of the RF signal. Such characteristics allow for both signals to be processed by the same RFDAC 21. As shown in FIG. 4B, a representation of the spectrum at the output of the RFDAC 21 shows that the PA control signal at baseband does not overlap or otherwise interfere with the RF signal.

The signal at the output of the RFDAC 21 is split into two paths. In the first path, a low-pass filtered version (generated by an analog low-pass filter or LPF 45) is used to the control the PA 4, for instance, by providing drain voltage control by the supply modulator 47 and/or by providing gate bias control by the power amplifier bias circuit 48. In the second path, a high-pass filtered version (generated by an analog high-pass filter or HPF 46) drives the RF input port of the PA 4.

Figure 5:
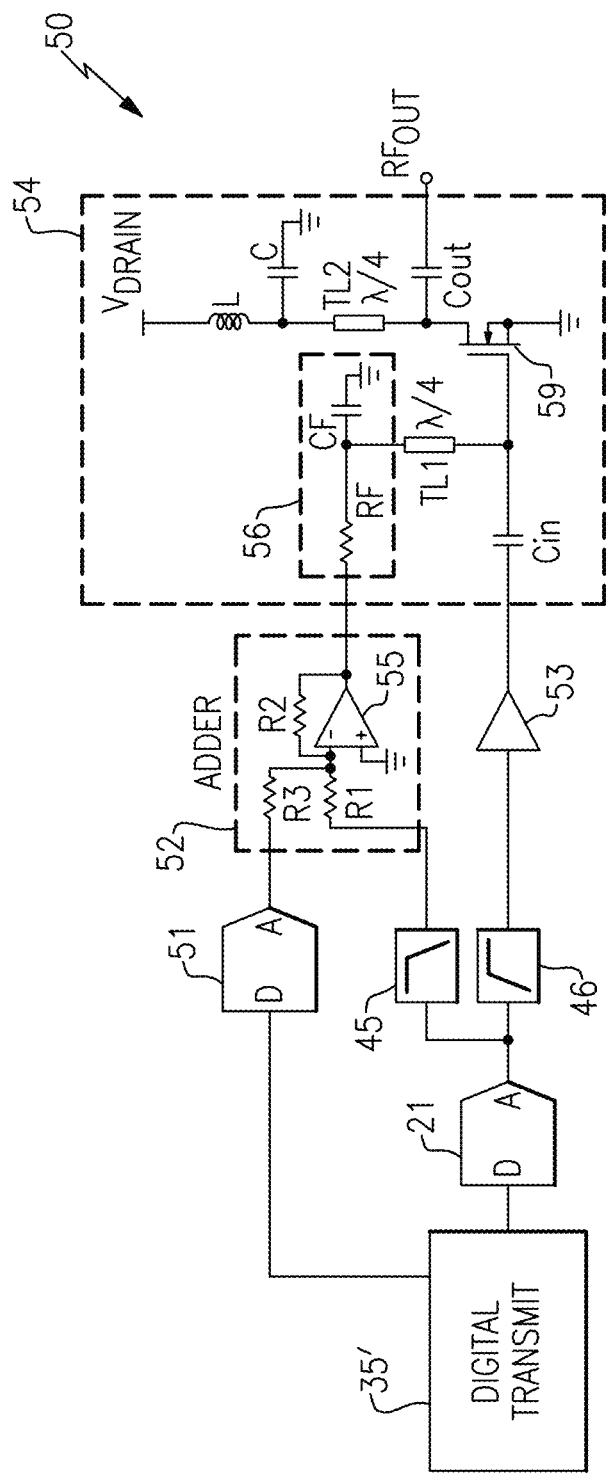
FIG. 5 is a radio transmitter with bias modulation according to one embodiment.

FIG. 5 is a radio transmitter 50 with bias modulation according to one embodiment. The radio transmitter 50 includes an RFDAC 21, a digital transmit circuit 35', a LPF 45, a HPF 46, an offset DAC 51, an analog adder 52, a power amplifier input stage 53 (also referred to herein as an RF driver amplifier), and a power amplifier output stage 54.

The analog adder 52 includes a first resistor R1, a second resistor R2, a third resistor R3, and an operational amplifier 55. The power amplifier output stage 54 includes an input capacitor Cin, an output capacitor Cout, a first quarter wave transmission line TL1, a second quarter wave transmission line TL2, a choke inductor L, a decoupling capacitor C, a bias filter 56, and a power transistor 59. The bias filter 56 includes a filter resistor RF and a filter capacitor CF.

In the illustrated embodiment, the output of the RFDAC 21 after low-pass filtering is used to generate a bias control signal used to perform gate modulation of the power transistor 59.

Gate modulation can be applied for a number of reasons but in GaN devices it is particularly useful to combat the negative effects of charge trapping. It can also be used as a form of analog predistortion to reduce distortion produced by the power amplifier.

The RFDAC 21 outputs a combined baseband and RF signal, which is provided to a low pass filter branch through the LPF 45 and to a high pass filter branch through the HPF 46. The low pass filter branch covers a frequency span from DC to hundreds of MHz (though charge trap correction can be less than this) and is a function of the RF signal envelope. However, using the RFDAC 21 to produce DC is somewhat wasteful in utilizing valuable dynamic range.

Accordingly, the offset DAC 51 is included to provide the large DC voltage desired to bias the gate of the power transistor 59. For example, the DC voltage of the power transistor 59 can often be many volts (with mV resolution). The bias control signal is then added to the DC offset voltage from the offset DAC 51 using the analog adder 52.

Accordingly, in the illustrated embodiment, the RFDAC 21 adds to the DC bias voltage and can provide additional DC shift in gate voltage as well as its time varying envelope driven low frequency AC waveform. The FET gate of the power transistor 59 receives this varying gate bias voltage (shown in this example through a quarter wave transmission line TL1 serving as a bias feed) plus the RF waveform via the RF driver amplifier 53 and AC coupling capacitor Cin. The gate of the power transistor 59 also receives the RF signal, while the drain of the power transistor 59 provides an amplified RF signal to an output terminal $RF_{OUT}$ through the output capacitor Cout.

Using the RFDAC 21 in this manner greatly simplifies the circuitry required for gate modulation requiring an RFDAC 21 plus a low frequency (kHz) DAC 51. The low frequency DAC 51 can have a lower cost than a traditional TXDAC with bandwidth and data line rates of many MHz.

The embodiment of FIG. 5 is depicted for a single transistor output stage. However, other amplifier stages with multiple transistors, such as Doherty output stages that include a main (carrier) transistor and an auxiliary (peaking) transistor can be used.

Figure 6:
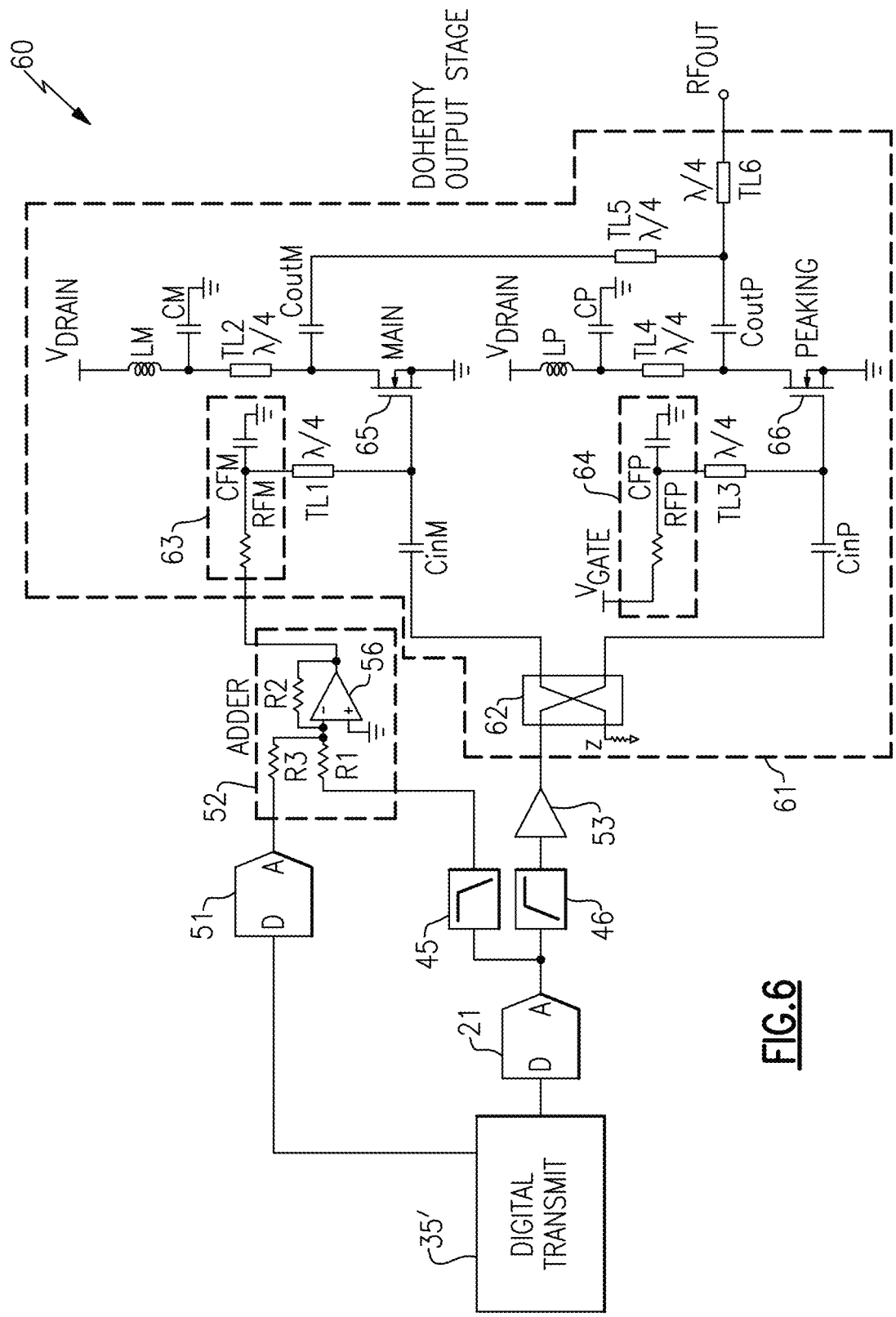
FIG. 6 is a radio transmitter with bias modulation according to another embodiment.

FIG. 6 is a radio transmitter 60 with bias modulation according to another embodiment. The radio transmitter 60 includes an RFDAC 21, a digital transmit circuit 35', a LPF 45, a HPF 46, an offset DAC 51, an analog adder 52, a power amplifier input stage 53, and a power amplifier output stage 61.

In the illustrated embodiment, the power amplifier output stage 61 includes a main amplifier and a peaking amplifier operating as a Doherty amplifier. The main amplifier and the peaking amplifier receive RF input signal components from an input splitter 62 (operating with a termination impedance Z).

The main amplifier includes a bias filter 63 (including a filter resistor RFM and a filter capacitor CFM), an input capacitor CinM, an output capacitor CoutM, a first quarter wave transmission line TL1, a second quarter wave transmission line TL2, a choke inductor LM, a decoupling capacitor CM, and a power transistor 65. The peaking amplifier includes a bias filter 64 (including a filter resistor RFP and a filter capacitor CFP), an input capacitor CinP, an output capacitor CoutP, a third quarter wave transmission line TL3, a fourth quarter wave transmission line TL4, a choke inductor LP, a decoupling capacitor CP, and a power transistor 66.

With continuing reference to FIG. 6, the RF outputs of the main amplifier and the peaking amplifier are combined with appropriate phase delays using the fifth quarter wave transmission line TL5 and the sixth quarter wave transmission line TL6 to generate an RF output signal provided to the RF output terminal $RF_{OUT}$.

In this example, gate modulation is applied to the main transistor 65 used for GaN charge trapping correction.

Since charge trapping behavior has its largest impact upon the lower envelope parts of the RF waveform, the peaking transistor is off during these sections and is not contributing to the output. Accordingly, biasing the main transistor 65 can be advantageous when using a Doherty output stage.

Figure 7:
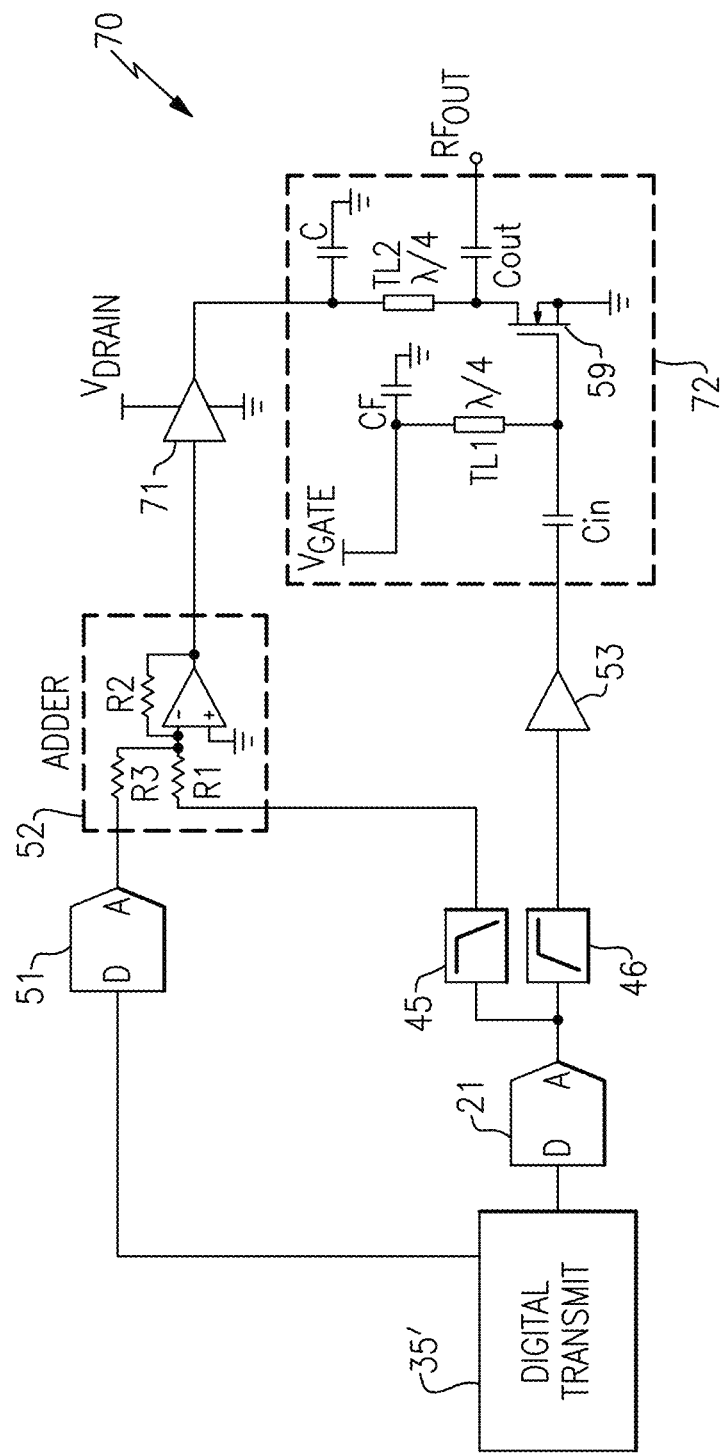
FIG. 7 is a radio transmitter with bias modulation according to another embodiment.

FIG. 7 is a radio transmitter 70 with bias modulation according to another embodiment. The radio transmitter 70 includes an RFDAC 21, a digital transmit circuit 35', a LPF 45, a HPF 46, an offset DAC 51, an analog adder 52, a power amplifier input stage 53, a control amplifier 71, and a power amplifier output stage 72.

The power amplifier output stage 72 includes an input capacitor Cin, an output capacitor Cout, a first quarter wave transmission line TL1, a second quarter wave transmission line TL2, a choke inductor L, a decoupling capacitor C, a filter capacitor CF, and a power transistor 59.

In this example, modulation is applied to a drain of the power transistor 59, thereby providing a technique known as envelope tracking.

As with gate modulation, a low frequency precision DAC 51 can be added to provide a DC bias to the output of the RFDAC 21 and reduce dynamic range of the RFDAC 21 in supporting this function. The control amplifier 71 amplifies the low control voltage from the analog adder 52 to generate a high voltage (up to 50 V in a typical application) with bandwidths in the tens to hundreds of MHz. The control amplifier 71 can be implemented using an arrangement of a switching and linear amplifier for high efficiency.

Applications

Devices employing the above described schemes can be implemented into various electronic devices. Examples of electronic devices include, but are not limited to, RF communication systems, consumer electronic products, electronic test equipment, communication infrastructure, etc. For instance, one or more RF transmitters can be included in a wide range of RF communication systems, including, but not limited to, radar systems, base stations, mobile devices (for instance, smartphones or handsets), phased array antenna systems, laptop computers, tablets, and/or wearable electronics.

The teachings herein are applicable to RF communication systems operating over a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

The RF signals transmitted by the RF transmitters herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

The invention claimed is:

1. A radio frequency (RF) communication system comprising:
    a transmitter configured to receive digital signal data and to output a combined analog signal having a low frequency content corresponding to an analog baseband control signal and a high frequency content corresponding to an RF transmit signal;
    a low pass filter configured to filter the combined analog signal to generate the analog baseband control signal;
    a high pass filter configured to filter the combined analog signal to generate the RF transmit signal;
    a power amplifier configured to amplify the RF transmit signal; and
    a modulator configured to modulate a supply voltage of the power amplifier based on the analog baseband control signal.

2. The RF communication system of claim 1, wherein the RF transmitter comprises a radio frequency digital-to-analog converter (RFDAC) configured to receive a digital combined signal, and to output the combined analog signal.

3. The RF communication system of claim 2, wherein the RF transmitter further comprises a digital envelope circuit configured to process digital signal data to extract a signal envelope and to generate a power control signal based on the signal envelope, a digital transmit signal processing circuit configured to process the digital signal data to generate a digital transmit signal, and a digital combiner configured to generate a digital combined signal based on combining the power control signal and the digital transmit signal.

4. The RF communication system of claim 1, further comprising a digital-to-analog converter (DAC) configured to output an offset voltage, and an analog combiner configured to combine the offset voltage and the analog baseband control signal to generate a modulation input signal for the modulator.

5. The RF communication system of claim 4, wherein the power amplifier includes a power field-effect transistor (FET), and the modulator controls a drain voltage of the power FET in relation to an envelope of the RF transmit signal indicated by the analog baseband control signal.

6. A radio frequency (RF) communication system comprising:
 a transmitter configured to receive digital signal data and to output a combined analog signal having a low frequency content corresponding to an analog baseband control signal and a high frequency content corresponding to an RF transmit signal;
 a low pass filter configured to filter the combined analog signal to generate the analog baseband control signal;
 a high pass filter configured to filter the combined analog signal to generate the RF transmit signal;
 a power amplifier configured to amplify the RF transmit signal; and
 a power amplifier bias circuit configured to modulate an input bias voltage of the power amplifier based on the analog baseband control signal.

7. The RF communication system of claim 6, further comprising a digital-to-analog converter (DAC) configured to output an offset voltage, and an analog combiner configured to combine the offset voltage and the analog baseband control signal to generate a bias input signal for the power amplifier bias circuit.

8. The RF communication system of claim 6, wherein the power amplifier includes a power FET, and the power amplifier bias circuit controls a gate voltage of the power FET based on the analog baseband control signal.

9. The RF communication system of claim 8, wherein the power amplifier includes a main transistor and a peaking transistor arranged as a Doherty amplifier, the power amplifier bias circuit configured to bias an input to the main transistor based on the analog baseband control signal.

10. A radio transmitter comprising:
 a digital envelope circuit configured to process digital signal data to extract a signal envelope, and to generate a power control signal based on the signal envelope;
 a digital transmit signal processing circuit configured to process the digital signal data to generate a digital transmit signal;
 a digital combiner configured to generate a digital combined signal based on combining the power control signal and the digital transmit signal; and
 a radio frequency digital-to-analog converter (RFDAC) configured to receive the digital combined signal, and to output a combined analog signal including a low frequency content corresponding to an analog baseband control signal and a high frequency content corresponding to an RF transmit signal.

11. The radio transmitter of claim 10, wherein the digital signal processing circuit provides at least one of digital pre-distortion (DPD) or crest factor reduction (CFR).

12. A method of radio frequency (RF) signal transmission, the method comprising:
 outputting a combined analog signal from a transmitter, the combined analog signal having a low frequency content corresponding to an analog baseband control signal and a high frequency content corresponding to an RF transmit signal;
 filtering the combined analog signal to generate the analog baseband control signal using a low pass filter;
 filtering the combined analog signal to generate the RF transmit signal using a high pass filter;
 amplifying the RF transmit signal using a power amplifier; and
 modulating a supply voltage of the power amplifier based on the analog baseband control signal.

13. The method of claim 12, wherein outputting the combined analog signal from the transmitter includes providing the combined output signal from an output of a radio frequency digital-to-analog converter (RFDAC).

14. The method of claim 12, further comprising controlling an input bias voltage of the power amplifier based on the analog baseband control signal.

15. The method of claim 12, further comprising generating an offset voltage using a digital-to-analog converter (DAC), and combining the offset voltage and the analog baseband control signal using an analog combiner.

16. The method of claim 12, wherein the power amplifier includes a main transistor and a peaking transistor arranged as a Doherty amplifier, the method further comprising controlling a bias of an input to the main transistor based on the analog baseband control signal.

17. The method of claim 12, wherein outputting the combined analog signal from the transmitter includes generating a digital combined signal based on combining a power control signal and a digital transmit signal using a digital combiner, providing the digital combined signal to an input of a radio frequency digital-to-analog converter (RFDAC), and outputting the combined analog signal from the RFDAC.

18. The method of claim 17, further comprising processing digital signal data to extract a signal envelope using a digital envelope circuit, and generating the power control signal based on the signal envelope.

19. The method of claim 18, further comprising processing the digital signal data to generate the digital transmit signal using a digital transmit signal processing circuit.

20. The method of claim 19, further comprising providing at least one of digital pre-distortion (DPD) or crest factor reduction (CFR) using the digital signal processing circuit.

* * * * *